(12) United States Patent
Adkisson et al.

(10) Patent No.: US 7,193,289 B2
(45) Date of Patent: Mar. 20, 2007

(54) DAMASCENE COPPER WIRING IMAGE SENSOR

(75) Inventors: James W. Adkisson, Jericho, VT (US); Jeffrey P. Gambino, Westford, VT (US); Mark D. Jaffe, Shelburne, VT (US); Robert K. Leidy, Burlington, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/904,807

(22) Filed: Nov. 30, 2004

(65) Prior Publication Data

US 2006/0113622 A1    Jun. 1, 2006

(51) Int. Cl.
*H01L 27/14* (2006.01)
(52) U.S. Cl. ............... 257/431; 257/432; 257/440; 257/294; 257/292
(58) Field of Classification Search ............ 257/431, 257/432, 292, 294
See application file for complete search history.

(56) References Cited

U.S. PATENT DOCUMENTS

| | | | |
|---|---|---|---|
| 6,362,498 B2 | 3/2002 | Abramovich | |
| 6,611,013 B2 | 8/2003 | Rhodes | |
| 6,635,912 B2 | 10/2003 | Ohkubo | |
| 6,803,250 B1 * | 10/2004 | Yaung et al. | 438/70 |
| 6,861,686 B2 * | 3/2005 | Lee et al. | 257/291 |
| 2001/0010952 A1 | 8/2001 | Abramovich | |

(Continued)

FOREIGN PATENT DOCUMENTS

| | | |
|---|---|---|
| JP | 07-074331 | 3/1995 |
| JP | 2002-246579 | 8/2002 |

OTHER PUBLICATIONS

"TSMC Sees Bright Future for CMOS Image Sensor Technology", Foundry Watch, Jan. 2002, cover page and p. 4.
"Dongbu enters CMOS Image sensor foundry area, signs packaging deal with ASE", www.siliconstrategies.com, printed Apr. 27, 2004, pp. 1-4.

(Continued)

*Primary Examiner*—Zandra V. Smith
*Assistant Examiner*—Tsz Chiu
(74) *Attorney, Agent, or Firm*—Scully, Scott, Murphy & Presser, P.C.; Anthony J. Canale

(57) ABSTRACT

An image sensor array and method of fabrication wherein the sensor includes Copper (Cu) metallization levels allowing for incorporation of a thinner interlevel dielectric stack with improved thickness uniformity to result in a pixel array exhibiting increased light sensitivity. In the sensor array, each Cu metallization level includes a Cu metal wire structure formed at locations between each array pixel and, a barrier material layer is formed on top each Cu metal wire structure that traverses the pixel optical path. By implementing a single mask or self-aligned mask methodology, a single etch is conducted to completely remove the interlevel dielectric and barrier layers that traverse the optical path. The etched opening is then refilled with dielectric material. Prior to depositing the refill dielectric, a layer of either reflective or absorptive material is formed along the sidewalls of the etched opening to improve sensitivity of the pixels by either reflecting light to the underlying photodiode or by eliminating light reflections.

10 Claims, 18 Drawing Sheets

U.S. PATENT DOCUMENTS

| | | | |
|---|---|---|---|
| 2002/0033492 | A1 | 3/2002 | Lee et al. |
| 2003/0038293 | A1 | 2/2003 | Faen et al. |
| 2004/0000669 | A1 | 1/2004 | Yamamura |
| 2004/0251395 | A1* | 12/2004 | Takahashi et al. ....... 250/208.1 |
| 2005/0012124 | A1 | 1/2005 | Rhodes |
| 2005/0012166 | A1* | 1/2005 | Choi ........................... 257/414 |
| 2005/0087784 | A1 | 4/2005 | Lee et al. |
| 2005/0088551 | A1 | 4/2005 | Lee et al. |
| 2005/0121599 | A1* | 6/2005 | Mouli ..................... 250/208.1 |
| 2005/0253212 | A1* | 11/2005 | Nam et al. .................. 257/432 |

OTHER PUBLICATIONS

"An entirely new way to capture color. Introducing the Foveon X3® direct image sensor, a new generation of technology that works just like film", www.foveon.com/X3_tech.html, printed Jan. 18, 2005, pp. 1-3.

"TSMC Sees Bright Future for CMOS Image Sensor Technology", Foundry Watch, Jan. 2002, cover page and p. 4.

"Dongbu enters CMOS Image sensor foundry area, signs packaging deal with ASE", www.siliconstrategies.com, printed Apr. 27, 2004, pp. 1-4.

* cited by examiner

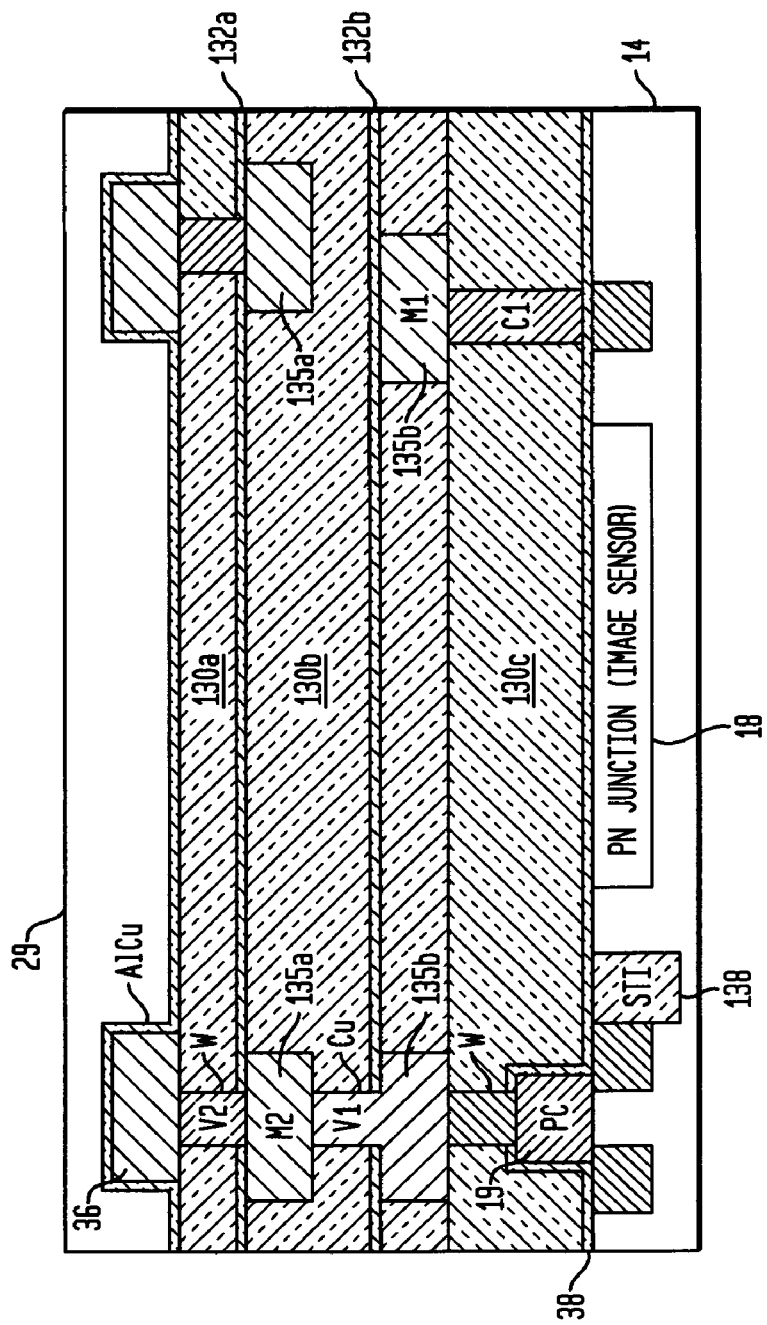

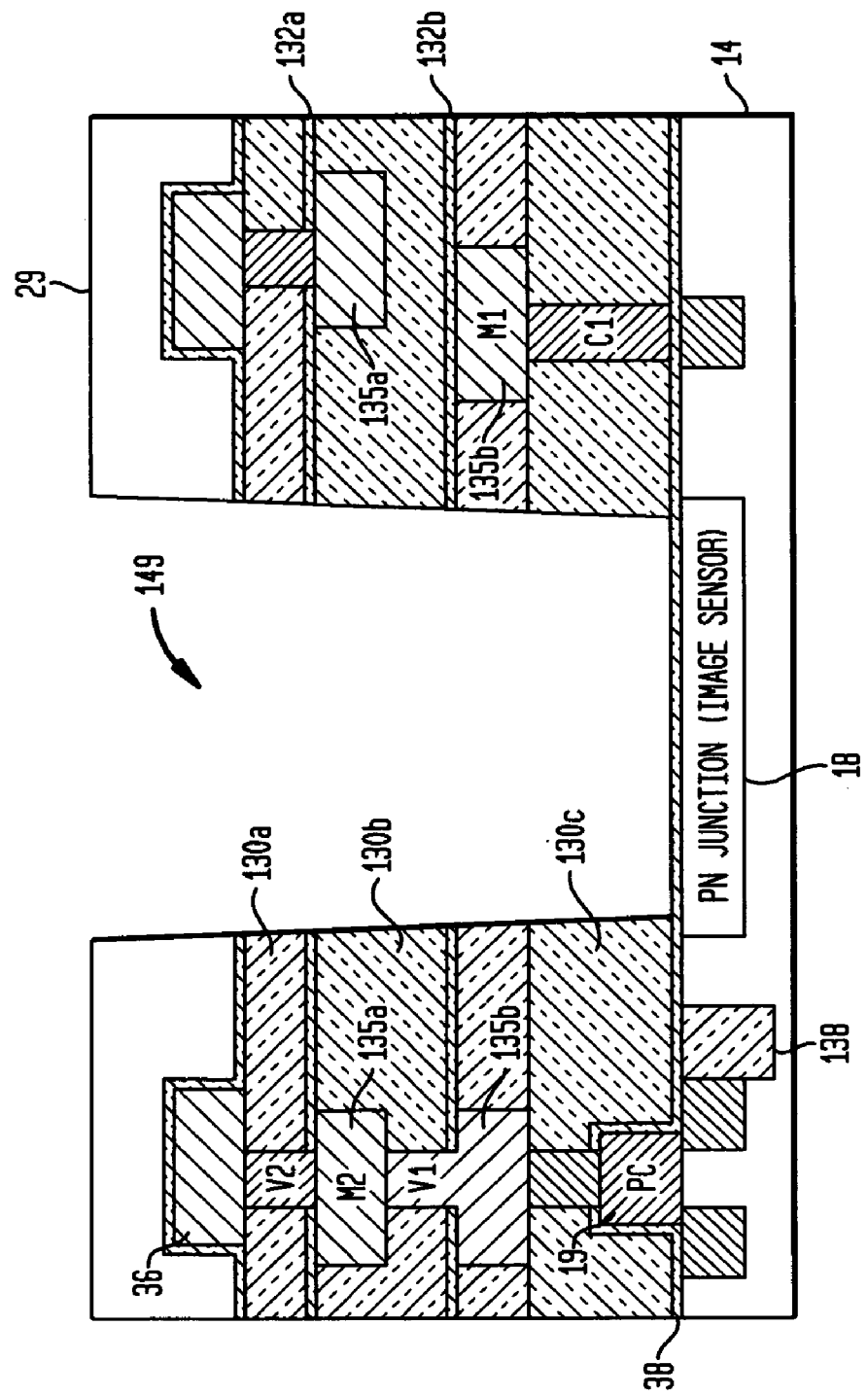

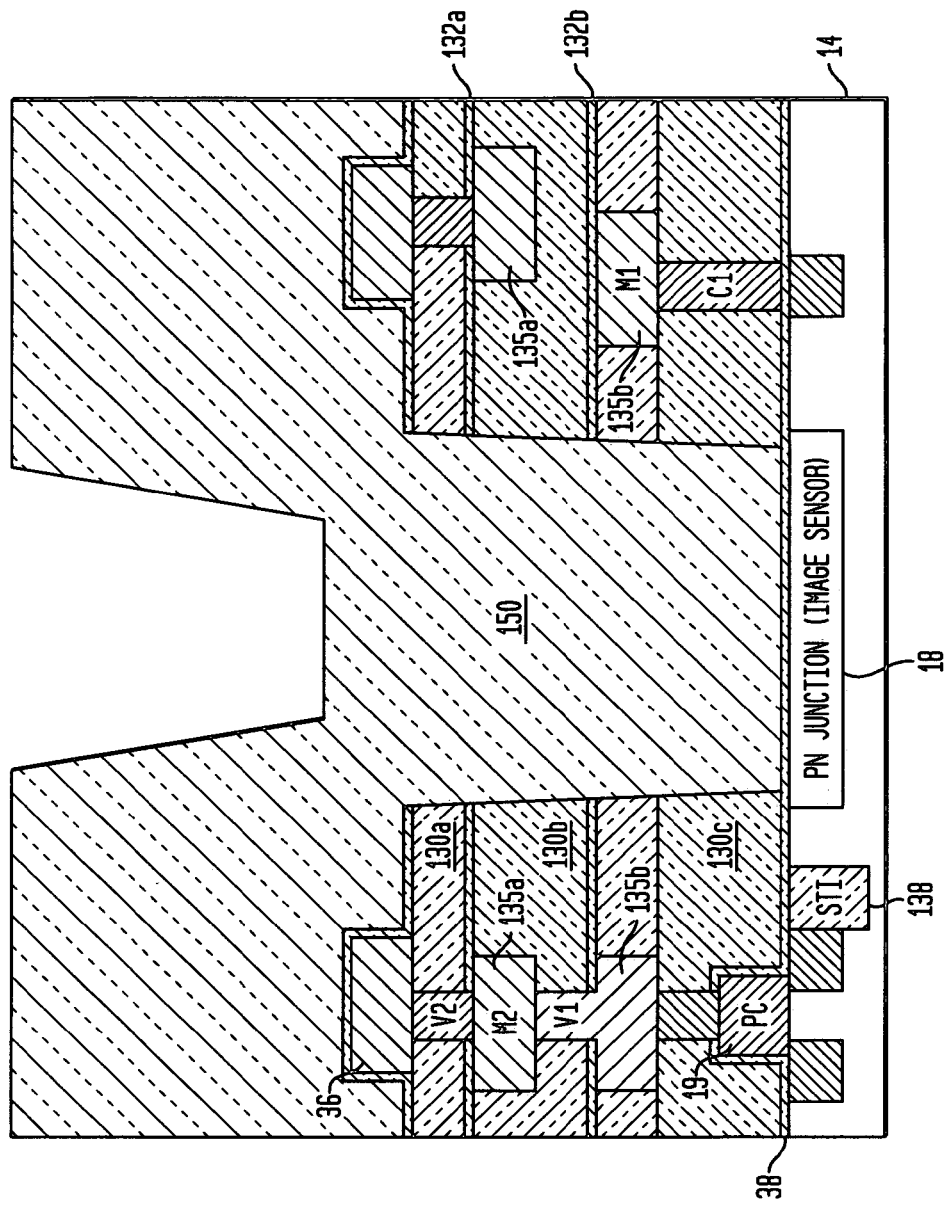

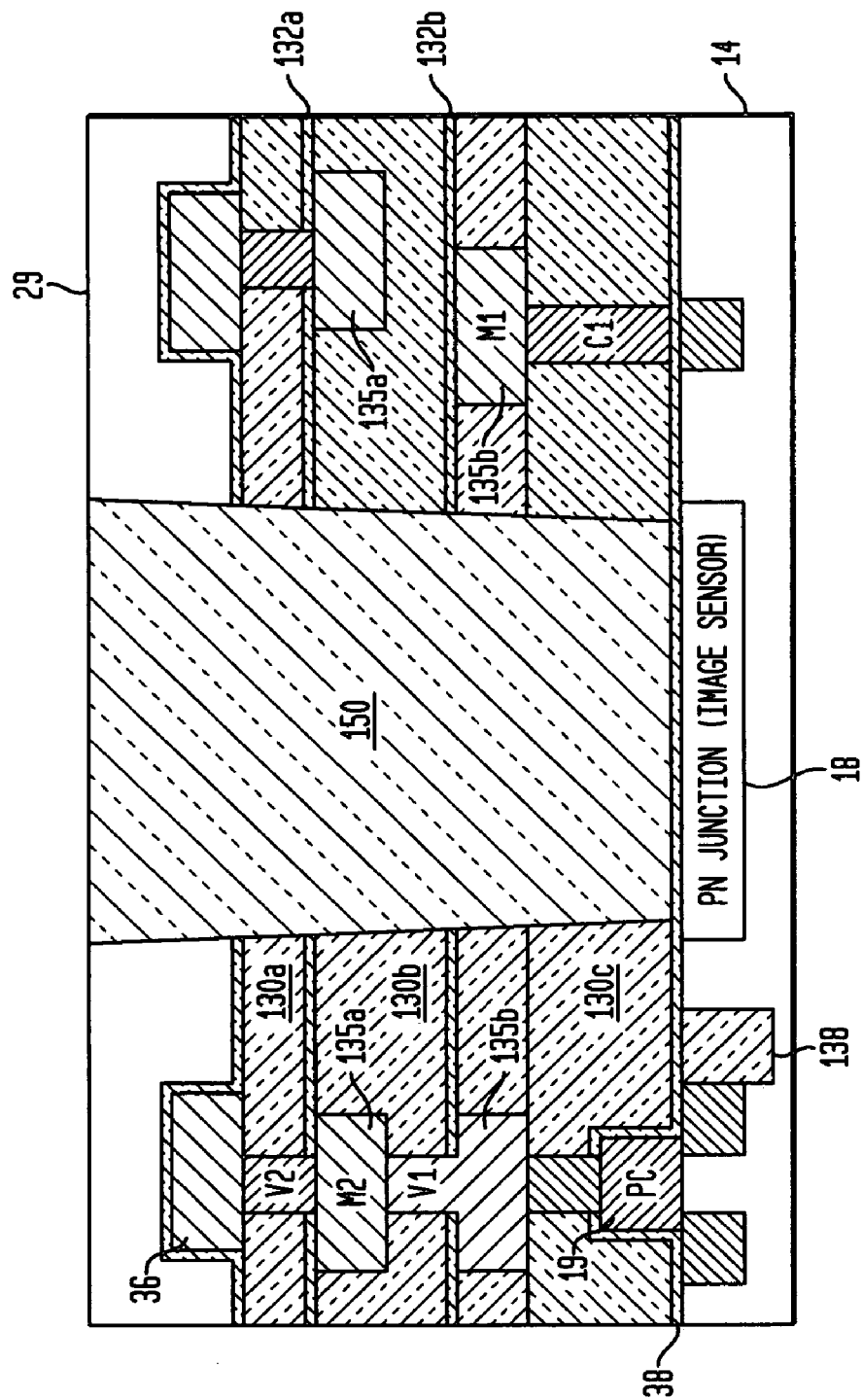

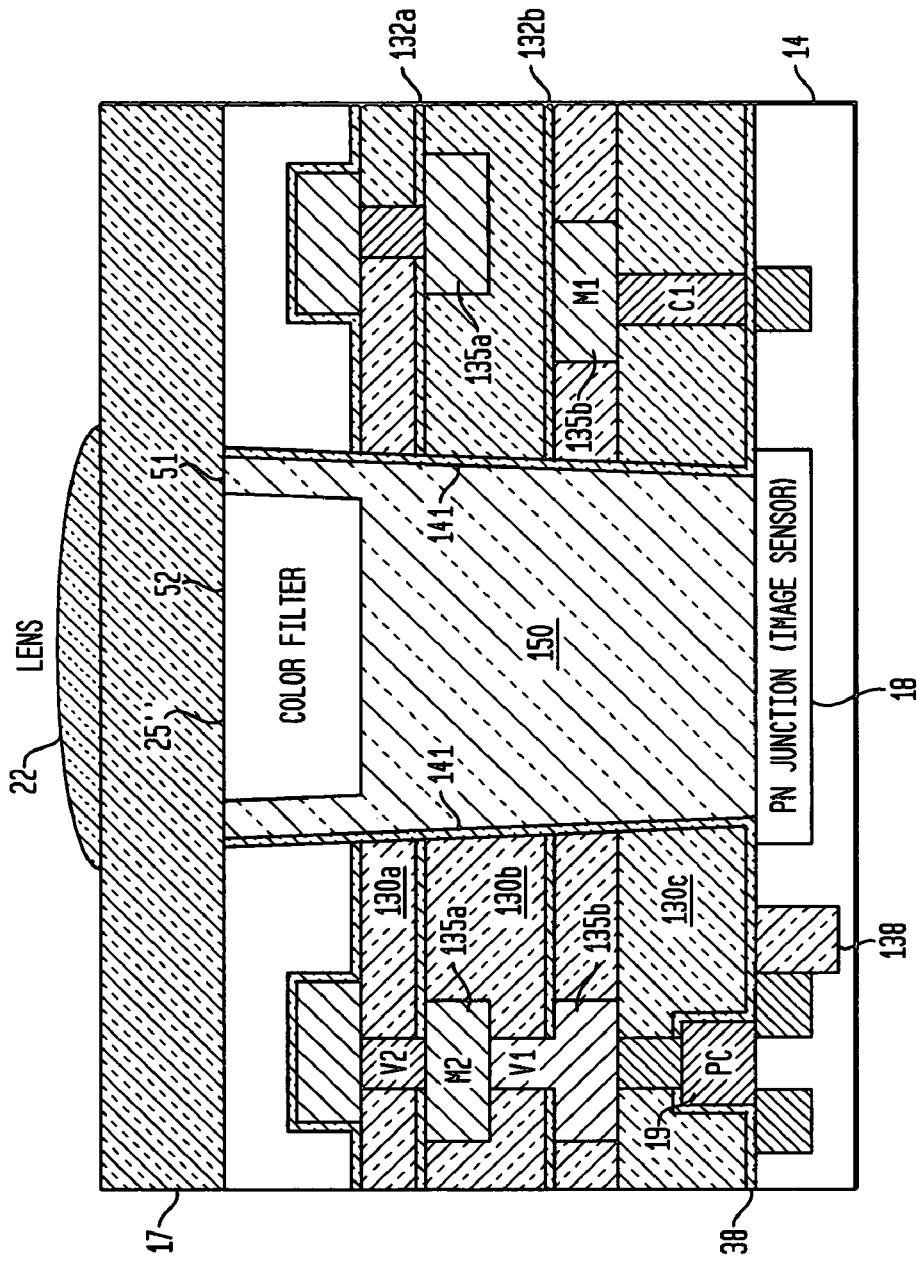

DAMASCENE COPPER WIRING IMAGE SENSOR

CROSS REFERENCE TO RELATED APPLICATIONS

The present invention is related to commonly-owned co-pending U.S. patent application Ser. No. 10/905,277 filed Dec. 23, 2004 and entitled AN IMAGE SENSOR WITH CU WIRING AND METHOD OF ELIMINATING HIGH REFLECTIVITY INTERFACES THEREFROM, the whole contents and disclosure of which is incorporated by reference as if fully set forth herein.

BACKGROUND OF THE INVENTION

1. Field of the Invention

The present invention related generally to the fabrication of semiconductor pixel imager arrays, and more particularly, to a novel semiconductor pixel imager structure and novel process therefor for increasing the sensitivity of the optical image sensors by optimizing the dielectric layer under the lenses.

2. Description of the Prior Art

CMOS image sensors are beginning to replace conventional CCD sensors for applications requiring image pick-up such as digital cameras, cellular phones, PDA (personal digital assistant), personal computers, and the like. Advantageously, CMOS image sensors are fabricated by applying present CMOS fabricating process for semiconductor devices such as photodiodes or the like, at low costs. Furthermore, CMOS image sensors can be operated by a single power supply so that the power consumption for that can be restrained lower than that of CCD sensors, and further, CMOS logic circuits and like logic processing devices are easily integrated in the sensor chip and therefore the CMOS image sensors can be miniaturized.

The patent literature is replete with references describing CMOS image sensor arrays and aspects of their manufacture. United States Patent Publication Nos. 2003/0038293, 2002/0033492 and 2001/0010952 describe typical state of the art CMOS image array designs, as do issued U.S. Pat. Nos. 6,635,912, 6,611,013 and 6,362,498. However, none of these state of the art devices described utilize Copper metallization layers in the pixel design. That is, AlCu metal levels are currently fabricated in current CMOS image sensors that require a thicker dielectric stack due to the increased resistivity of the Al metal. The thicker the dielectric means thicker interlevel dielectric layers are required which results in a reduced intensity of light that reaches the pixel photoconversion element (e.g., photodiode). Thus, the sensitivity of the CMOS imager pixel is compromised.

As the semiconductor industry is expected to stay with AlCu for 0.18 μm node CMOS image sensor technology, it would be highly desirable to provide a CMOS image sensor having damascene Copper (Cu) metal lines for the metallization (e.g., M1, M2) levels which would require a thinner interlevel dielectric stack which has less thickness variability due to the elimination of the dielectric CMP step required with subtractive etch AlCu wiring, thus increasing the sensitivity of the pixel array as more light will reach the photodiode. However, as passivation levels is required on Cu metals due to Copper's susceptibility to oxidation and contamination, a SiN, SiC, SiCN or like passivation layer is required above the copper wires. That is, SiN, SiC, SiCN or like layers used for damascene copper wiring as RIE stop and Cu diffusion barriers are not compatible with optical image sensors due to refractive index mismatch issues.

It would thus be highly desirable to provide an image sensor and method of manufacture wherein the sensor comprises Copper (Cu) metal lines for the metallization levels which resolves the refractive index mismatch issues and, at the same time, optionally increase the sensitivity of the optical image sensors by optimizing the dielectric layer under the lenses.

SUMMARY OF THE INVENTION

This invention addresses a structure and method for increasing the sensitivity of optical image sensors by optimizing the dielectric layer under the lenses in an imaging array implementing Cu wiring.

A number of embodiments of a novel semiconductor optical imager structure that eliminates most or all of the Cu diffusion barrier dielectric material (e.g. a nitride) under the image filtering coatings and lenses. This is accomplished by patterning and etching down to the silicon substrate, either leaving the nitride layer above the image sensor in place or removing it. Alternate embodiments add a dielectric or conductor spacer along the sidewall of the opening, and/or a metal guard ring structure around the opening to eliminate mobile ion contamination issues, and potentially reflect light from the sidewalls to the detector.

Thus, an image sensor and method of fabrication is provided wherein the image sensor includes Copper (Cu) metallization levels allowing for incorporation of a thinner interlevel dielectric stack with reduced thickness variability to result in a pixel array exhibiting increased light sensitivity. The image sensor is initially fabricated to include thin (e.g. 1–100 nm) dielectric barrier layer (e.g. PECVD or HDPCVD SiN, SiC, SiCN, etc.) above each interlevel Cu metallization that traverses the optical path of each pixel in the sensor array. Then, by implementing a single mask or self-aligned methodologies, an etch is conducted to completely remove the barrier layer metal at locations of the optical path for each pixel in the array, and subsequently, a refill dielectric is provided to fill the etched opening. In alternate embodiments, prior to depositing the refill dielectric, a layer of either reflective or absorptive material is formed along the sidewalls of the etched opening to improve sensitivity of the pixels by either reflecting light to the underlying photodiode or by eliminating light reflections.

According to one aspect of the invention, there is provided there is provided an image sensor including an array of pixels, each pixel comprising:

a top layer comprising a pixel microlens for receiving light;

a semiconductor substrate including a light sensitive element formed therein for receiving light incident to said pixel microlens;

a structure of dielectric material provided in an optical path between the top layer and the light sensitive element formed in the substrate, and a stack of interlevel dielectric material layers having one or more levels of Cu metallization formed therebetween with each metallization level including a Cu metal wire structure formed adjacent the dielectric material structure of the pixel, each Cu metal wire structure including a barrier material layer formed thereon, wherein the dielectric material structure is formed as part of a dielectric refill process after etching an opening in the pixel to define the optical path.

According to a further aspect of the invention, there is provided method for fabricating an image sensor array of pixels, each pixel comprising a top layer comprising a pixel microlens for receiving light, the method comprising the steps of:

forming a light sensitive element in a semiconductor substrate for each array pixel, the light sensitive element adapted to receive light incident to a respective pixel microlens;

forming a stack of interlevel dielectric layers atop the substrate, and between forming of adjacent interlevel dielectric layers of the stack, the steps of: forming a Cu metallization level including a Cu metal wire structure formed at locations between each pixel in said array and, forming a barrier material layer on top each said Cu metal wire structure;

removing a portion of the stack of interlevel dielectric layers above the light sensitive element to define an optical path of a pixel; and, refilling the removed portion of the stack in the optical path with dielectric material between the top layer and the light sensitive element.

Advantageously, the method for fabricating the image sensor array of pixels includes implementing a single mask or self-aligned mask methodology, that enables a single etch to be conducted to completely remove the dielectric stack and some or all of the barrier layer metals that traverse the optical path for each pixel.

In alternate embodiments, prior to depositing the refill dielectric, a layer of either reflective or absorptive material may be formed along the sidewalls of the etched opening to improve sensitivity of the pixels by either reflecting light to the underlying photodiode or by eliminating light reflections.

BRIEF DESCRIPTION OF THE DRAWINGS

The objects, features and advantages of the present invention will become apparent to one skilled in the art, in view of the following detailed description taken in combination with the attached drawings, in which:

FIGS. 2(a)–2(c) depict, through a cross-sectional views, the image sensor process steps resulting in a structure having the final wiring levels and passivation dielectric (FIG. 2(a)), the subsequent etched openings for the terminal via/wirebond or soldier bump pads, and the opening for the image sensor color filter (FIG. 2(b)), and, the wafer processing and packaging the chip with an optional lens and wirebonding (FIG. 2(c));

FIGS. 3(a)–3(f) depict, through a cross-sectional views, the image sensor process steps for planarizing the image sensor utilizing a reverse opening mask (opposite polarity resist) followed by an etchback process and, an optional CMP step performed;

DETAILED DESCRIPTION OF THE PREFERRED EMBODIMENTS

Figure 1:
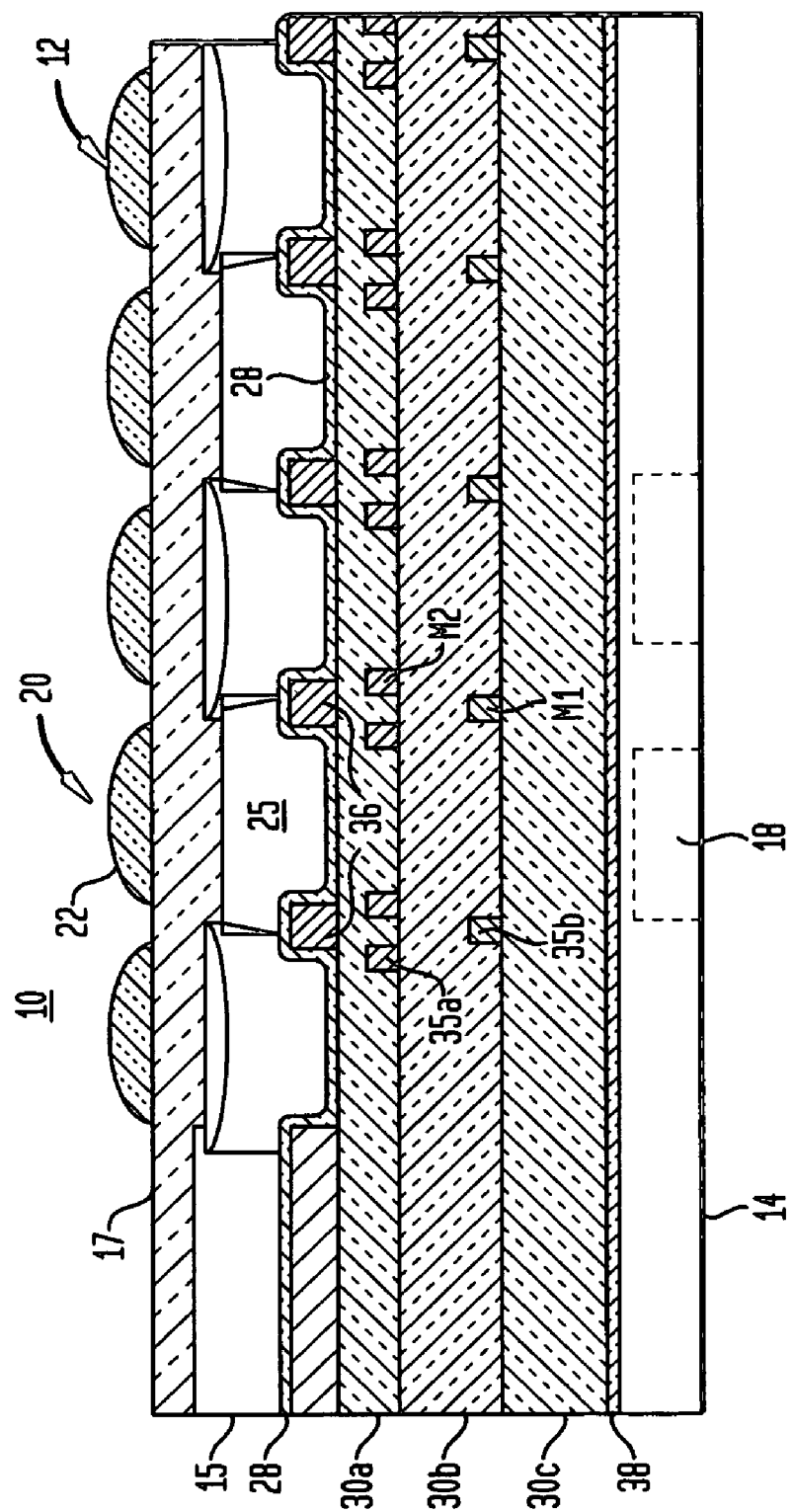
FIG. 1 depicts an image sensor pixel array 10.

FIG. 1 depicts image sensor pixel array 10. As shown, the array comprises a plurality of microlenses 12, each having a hemisphere shape, arranged on a smooth planarization layer 17, e.g., a spin on polymer, that is formed on top of a color filter array 15 enabling formation of the microlens array. The color filter array 15 includes individual red, green and blue filter elements 25 (primary color filters) or alternately, cyan, magenta and yellow filter elements (complementary color filter). Each microlens 22 of the microlens array 12 is aligned with a corresponding color filter element 25 and comprises an upper light receiving portion of a pixel 20. The pixel 20 includes a cell portion fabricated upon a semiconductor substrate 14 portion including a stack of comprising one or more interlevel dielectric layers 30a–30c incorporating metallization interconnect levels M1, M2 Aluminum (Al) wire layers 35a, 35b. Interlevel dielectric materials may comprise a polymer or $SiO_2$, for example. As Al metallization interconnect layers 35a, 35b do not require passivation, no respective barrier layers are shown. As further shown in FIG. 1, each pixel cell 20 having the Al metallizations 35a,b further includes a final Aluminum metal level 36 that enables wire bonding to the M1 and M2 metallizations between each pixel 20, and a final passivation layer 28 is formed above the wire bonding level 36. This final passivation layer 28 may comprise SiN, $SiO_2$, SiC, SiCN, SiON or combinations of these. Although not shown in detail, each pixel 20 includes a photoelectric converting device including a light sensitive element such as a photodiode 18 that performs photoelectric conversion and a transistor (not shown) that performs charge amplification and switching. Each of the pixels 20 generates a signal charge corresponding to the intensity of light received by each pixel and is converted to a signal current by the photoelectric conversion (photodiode) element 18 formed on semiconductor substrate 14. A further barrier or capping layer, e.g., a nitride such as SiN layer 38, is formed above unsilicided diffusion regions formed at the Si substrate 14 surface.

The use of Aluminum metal levels 35a, 35b in image sensors require a thicker dielectric stack due to the increased resistivity of the Al metal. The thicker the dielectric means thicker dielectric layers 30a–30c are required which results in a reduced intensity of light that reaches the photoconversion element (photodiode), i.e., the sensitivity of the pixel 20 is compromised.

The present invention is directed image sensor technology having damascene Copper (Cu) metal lines for the M1, M2 levels that require a thinner interlevel dielectric stack which has less thickness variability due to the elimination of the dielectric CMP or other planarization step required with subtractive etch AlCu wiring, thus increasing the sensitivity of the pixel array as more light will reach the photodiode. While a passivation level is required on Cu metals due to Copper's susceptibility to oxidation and contamination; and to block Cu diffusion into the surrounding dielectrics, a SiN, SiC, SiCN or like passivation layer is required above the copper wires. However, SiN, SiC, SiCN or like layers used for damascene copper wiring as RIE stop and Cu diffusion barriers are not compatible with optical image sensors due to refractive index mismatch issues and are thus eliminated from the optical path in the image sensor pixel according to the invention.

Figure 2:
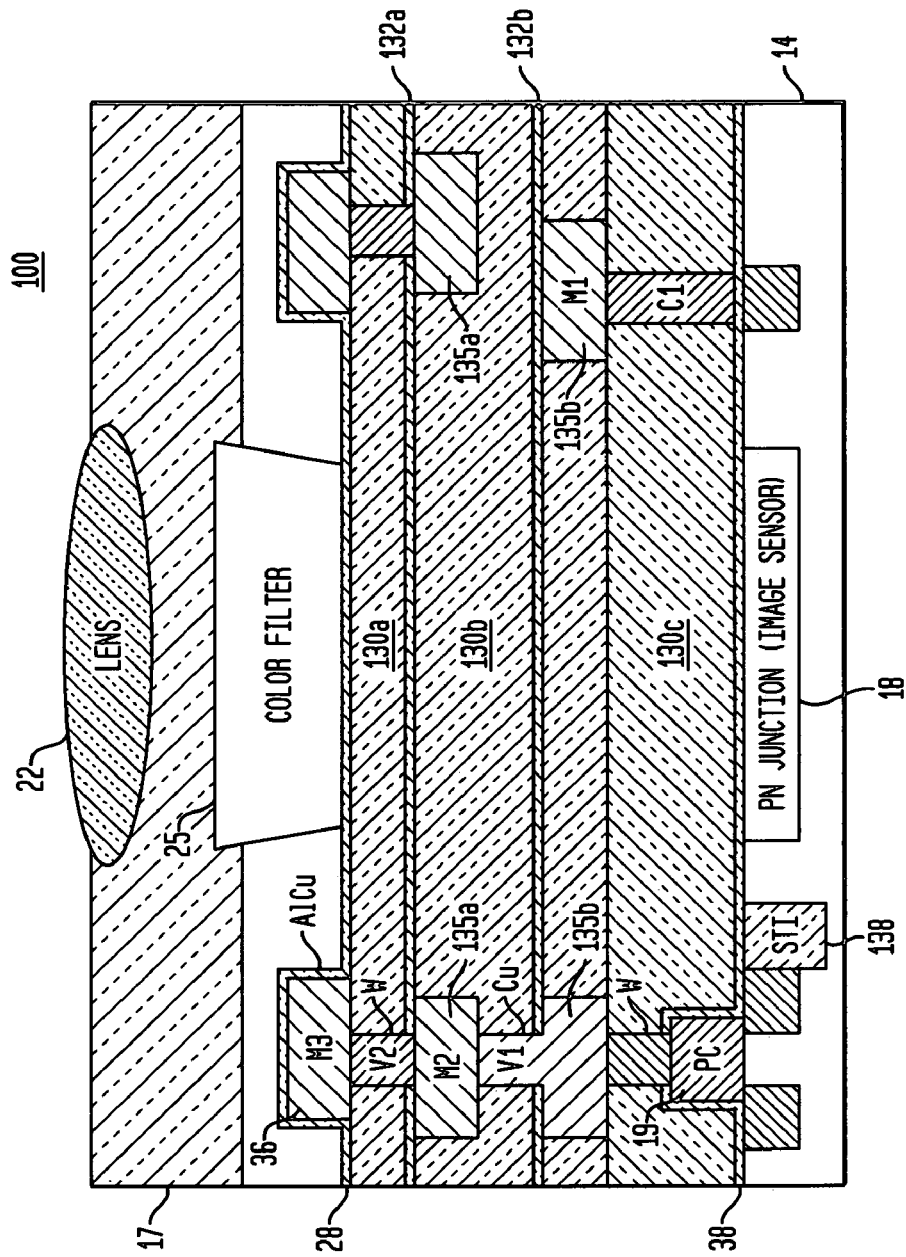
FIG. 2 illustrates, through a cross-sectional view, the image sensor array pixel having copper interlevel wiring including multiple Cu diffusion barrier layers traversing the pixel's optical path.
Figure 2B:
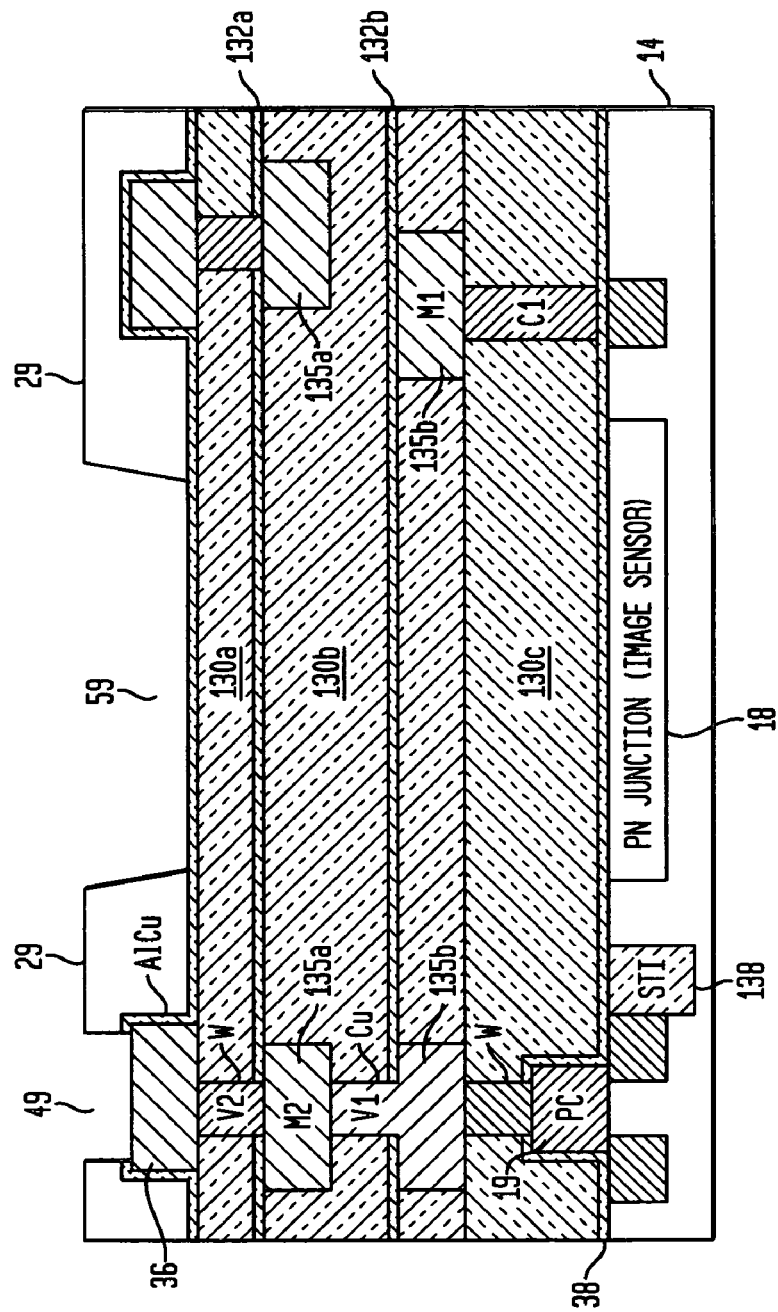
Figure 2C:
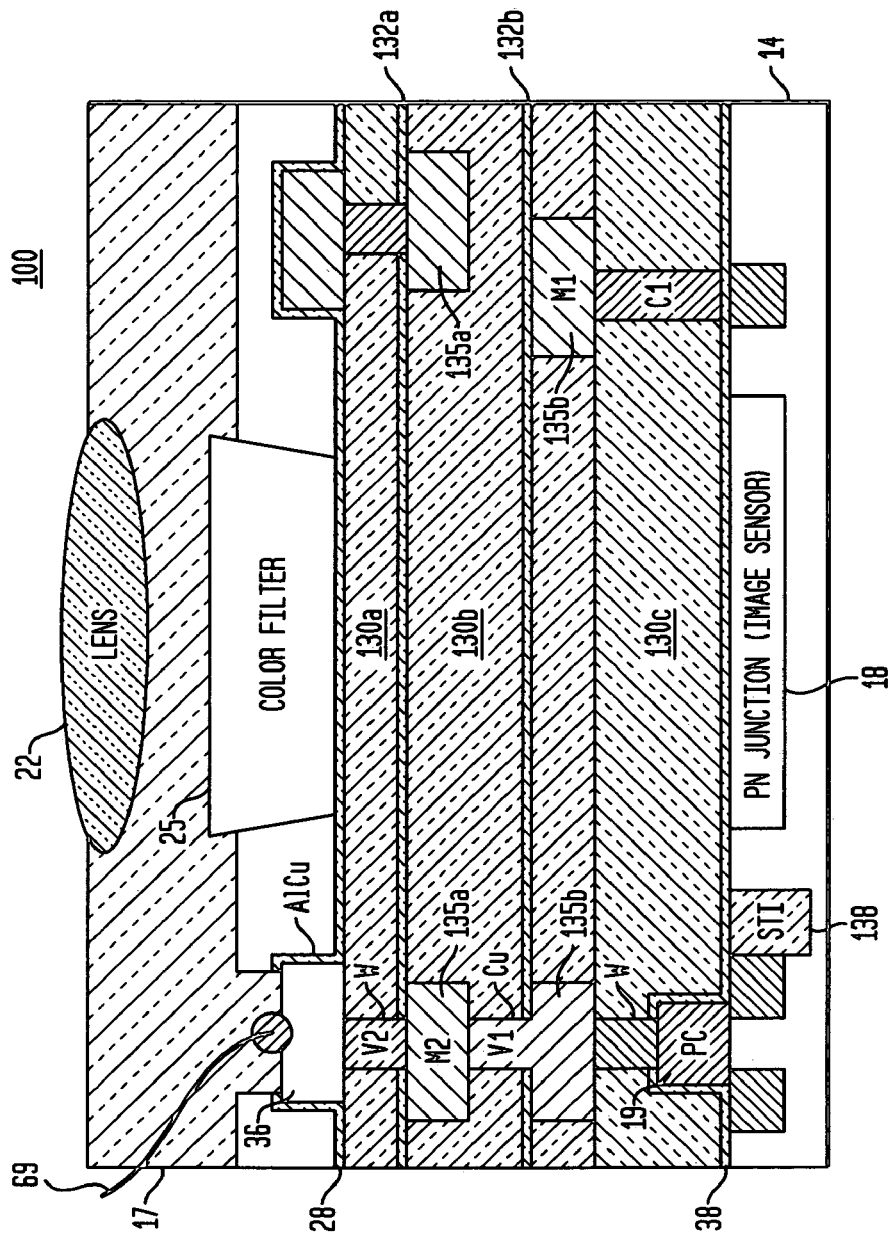

FIG. 2 illustrates, through a cross-sectional view, a back end of line (BEOL) image sensor array 100 similar to the embodiment described in commonly-owned, co-pending, U.S. patent application Ser. No. 10/905,277 filed Dec. 23, 2004 and entitled AN IMAGE SENSOR WITH CU WIRING AND METHOD OF ELIMINATING HIGH REFLECTIVITY INTERFACES THEREFROM having a copper wiring including multiple Cu diffusion barrier layers. While the upper light receiving portion of the pixels 20 (microlens 22 and color filters 25) are the same as the prior art depicted in FIG. 1, the invention includes the formation of Cu metallization interconnects M1, M2 allowing for the formation of thinner stack of interlevel dielectric layers 130a–130c formed on the substrate 14. The substrate 14 may be a bulk semiconductor including, for example, Si, SiGe, SiC, SiGeC, GaAs, InP, InAs and other III–V compound semiconductors, II–VI, II–V, etc. compound semiconductors, or layered semiconductors such as silicon-on-insulators (SOI), SiC-on-insulator (SiCOI) or silicon germanium-on-insulators (SGOI), or insulating substrates, such as quartz or alumina. Preferably, the interlevel dielectric material may comprise an organic or inorganic interlevel dielectric (ILD) material which may be deposited by any of number of well known techniques such as sputtering, spin-on, or PECVD and may include a conventional spun-on organic dielectrics, spun-on inorganic dielectrics or combinations thereof which have a dielectric constant of about 4.2 or less. Suitable organic dielectrics that can be employed in the present invention include dielectrics that comprise C, O, F, and/or H. Examples of some types of organic dielectrics that can be employed in the present invention include, but are not limited to: aromatic thermosetting polymeric resins, for example, resins sold by DOW Chemical Company under the tradename SiLK®, Honeywell under the tradename Flare®, and similar resins from other suppliers, and other like organic dielectrics. These organic dielectric employed as interlevel dielectric layers may or may not be porous, with porous organic dielectric layers being preferred due to the reduced k value. Suitable inorganic dielectrics that may be employed as the interlevel dielectric typically comprise Si, O and H, and optionally C, e.g., $SiO_2$, FSG (fluorosilicate glass), SiCOH, carbon-doped oxides (CDO), silicon-oxicarbides, organosilicate glasses (OSG) deposited by plasma enhanced chemical vapor deposition (CVD) techniques. Illustrative examples of some types of inorganic dielectrics that can be employed include, but are not limited to: the silsesquioxane HOSP (sold by Honeywell), methylsilsesquioxane (MSQ), hydrogen silsesquioxane (HSQ), MSQ-HSQ copolymers, SiO2 deposited using tetraethylorthosilicate (TEOS) or SiH4 as a silicon source and $O_2$, N2O, NO, etc. as an oxidizer; organosilanes and any other Si-containing material. For purposes of discussion it is assumed that the inorganic dielectric material is $SiO_2$.

Referring to FIG. 2, the front-end-of-the-line (FEOL) pre first wiring level (M1) structures, i.e. MOS transistors, image sensors, etc.; and the tungsten or other metal conductor contact to the FEOL structures are fabricated as known in the art. The methodology for forming the M1 layer includes first depositing the $SiO_2$ or other dielectric layer 130c, e.g., to a thickness ranging between about 2 kÅ to 20 kÅ with a range of between 4 kÅ and 5 kÅ preferred, on top of the substrate capping layer 38, patterning trenches in the $SiO_2$ layer 130c using known lithography and RIE techniques, and, lining the formed trenches with a metal liner such as one or more refractory metals, e.g., Ta, TaN, TiN, TiSiN, W, WCN, Ru. Then, the lined trenches are filled with a copper material to form the Cu M1 layer 135b which is subsequently polished using known CMP technique. Thereafter, a barrier or Cu diffusion layer 132b, such as SiN, is deposited on top of the Cu M1 metallization, e.g., to a thickness ranging between about 2 nm to 200 nm with a range of between 20 nm–70 nm preferred. In this embodiment, the thickness of the nitride layer 132b on top of the Cu interconnect is reduced to minimize reflectance. It is understood that other barrier layers materials may be used including, but not limited to, SiON, SiC, SiCN, SiCON, SiCO materials etc. The process is repeated for the subsequent dual-damascene second Cu wire level M2 and first via level V1 metallization layer whereby a thin M2/V1 dielectric layer 130b, e.g., $SiO_2$, is deposited over the Cu diffusion layer 132b, to a thickness ranging between about 2 kÅ to 20 kÅ, preferably 1 micron, and then the M2/V1 metallization layers are formed by patterning trenches and vias in the $SiO_2$ layer 130b using known lithography and RIE techniques, lining the formed trenches and vias with a metal liner such as a refractory metal, and, filling the lined trenches with a copper material to form the Cu M2 135a layer which is subsequently polished using known CMP technique. Thereafter, a barrier or Cu diffusion layer 132a, such as SiN, is deposited on top of the Cu M2 layer 135a, e.g., to a thickness ranging between about 20 Å to 2 kÅ. The subsequent steps include forming the interlevel dielectric layer 130a on top of the diffusion layer 132a, forming a damascene tungsten or other conductor via, and the final subtractive etch AlCu metallization 36 according to known techniques. Alternatively, a tapered via, in place of the damascene tungsten via, as known in the art, could be employed. It is preferred that, in the embodiment depicted in FIG. 2, the total thickness of both the M1 and M2 diffusion barriers be about 20 nm or less, in order to minimize reflectance.

As shown in FIG. 2, a stack of interconnected metal lines and vias is provided including interlevel metallization layer M1 connected to metallization level M2 by a metal via, e.g., V1, comprising a conductive material, e.g., a metal such as Copper, and, likewise, interlevel metallization layer M2 connected to metallization level M3 by a metal via, e.g., V2, comprising a conductive material, e.g., a metal such as Tungsten. Likewise, as shown in FIG. 2, the interlevel metallization layer M1 is connected to an active device region 19 (or other diffusion region) formed on substrate 14 via a damascene contact, C1, or plug, e.g., comprising a metal such as Tungsten. Further to the embodiment depicted in FIG. 2, it should be understood that an additional layer of materials (not shown) with an index of refraction in between that of SiN (1.98) and SiO$_2$ (1.46), such as SiON, can be formed on top of the thin SiN layers 132a,b to comparable thicknesses (e.g., about 20 Å to 2 kÅ) to aid in reducing light reflections.

According to the embodiment described with respect to FIG. 2, the provision of Cu metallization and corresponding thin interlevel dielectric layers 130a–130c and ultrathin diffusion barrier layers 132a,b in the optical path minimizes light reflectance, thus allowing greater amounts of light 13 to flow through the optical path of pixel 20 and reach underlying photodiode element 18. Further, in the embodiment described in FIG. 2, there is shown an additional shallow trench isolation (STI) isolation dielectric region 138 formed adjacent the active silicon region 19 and light sensitive element, e.g., photodiode 18.

Figure 3:
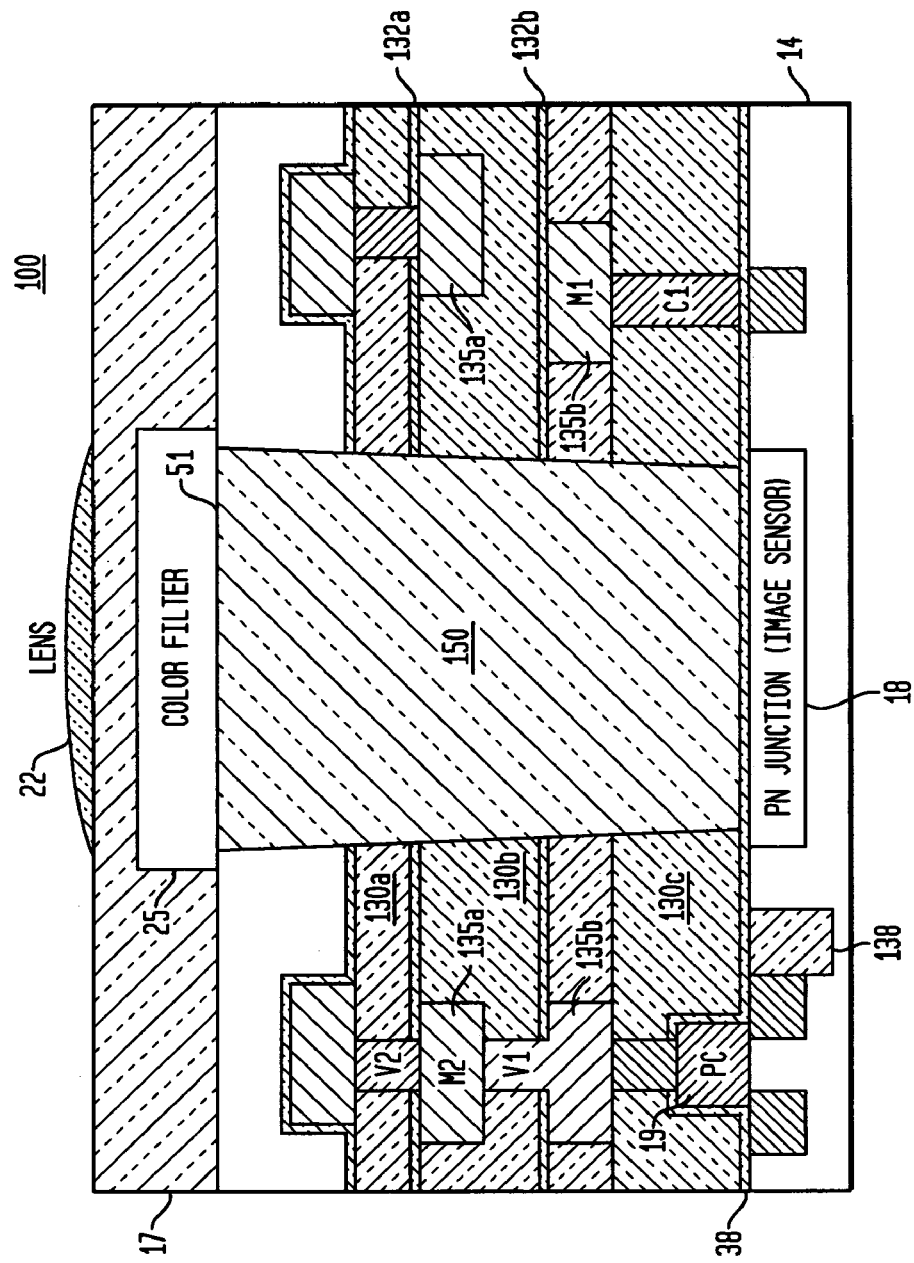
FIG. 3 illustrates, through a cross-sectional view, the image sensor array pixel of the invention formed without a reflective liner material at the sidewalls of an etched pixel opening.

According to the preferred embodiment of the invention, the imager of FIG. 3 including active devices (transistors) 19, the substrate capping layer 38, interlevel dielectric layer 130a, interlevel metallization 135b (M1) and corresponding barrier layer 132b, the M2 dielectric layer 130b, metallization M2 135a and corresponding barrier layer 132a, and final dielectric layer 130c is fabricated up to last metal level M3 comprising the final Aluminum metal level 36. Note that, although three levels of wiring are shown, two in Cu and one in AlCu, any number of wiring levels could be used. A photolithograpic mask is subsequently patterned to open up an area corresponding to each pixel in a subsequent single step etch process and a wet or dry etch is conducted to create a hole 51 effectively removing portions of the interlevel dielectric 130c, the Nitride barriers 132a for the M2 layer from the pixels' optical paths and, in the same etch process step, the M2 dielectric layer 130b and the M1 barrier 132b and M1 dielectric layer 130a. If a RIE etch is used, then standard parallel plate, downstream plasma, or high density plasma chambers could be used with perfluorocarbon (PFC) and/or hydrofluorocarbon (HFC) gases used as a fluorine source and oxygen, hydrogen, nitrogen, argon, etc. used as dilutant gases, as known in the art. If a wet etch is used, then dilute hydrofluoric acid could be used to etch SiO2 or similar oxide films; phosphoric acid could be used to etch SiN or similar films, etc. as known in the art. Preferably, the opening 51 is patterned and etched down to the nitride barrier 38, however, it is understood that the opening may be etched down to the surface of the substrate 14 by removing the nitride barrier 38, followed by standard cleaning steps. An opening 51 formed in the pixel may be of the order of about 1 μm–3 μm deep, and of the order of about 1 μm–5 μm wide. The etched opening 51 is shown in FIG. 3 to be tapered (i.e., having a wider top opening than bottom), however, it is understood that it may be formed in a reverse taper (wider bottom than top opening) or, the etch may form sidewalls that are substantially parallel.

After this single etch, as shown in FIG. 3, an interlevel dielectric (e.g., oxide) material 150 is deposited back into the etched path 51, e.g. a spin-on refill process, such as spin-on dielectric (SiO$_2$), spin-on glass, etc., and a planarization step is performed. It is understood that the refill dielectric material may alternately comprise a polymer dielectric (photosensitive polyimide, Dow Chemical's SiLK®, etc.) and that other techniques for depositing the interlevel dielectric (oxide, SiO$_2$, or carbon-based oxides, etc.) having excellent gap fill capability such as CVD or (plasma enhanced) PE-CVD processing may be used. Preferably, an atmospheric pressure CVD (APCVD) or sub-atmospheric pressure CVD (SACVD) deposition technique is used to achieve 99% conformity; if SACVD with a deposition temperature of 400 C. is used, then use undoped SiO$_2$ since no post deposition anneal is needed. It should be understood that the thickness of the deposited dielectric depends on the method of deposition and subsequent processing methods employed. For example, a thickness of SACVD SiO2 slightly greater than the lesser of the trench depth or ½ the trench width is deposited if no recess is planned of image sensor filtering coating; alternately, a thickness less than trench depth is deposited if an optional self aligned recess is planned of image sensor filtering coating. If a spin-on dielectric is used, the spin-on parameters (shot size, spin speed, subsequent bake temperatures) would be optimized to achieve fill of the opening 150 with minimal deposition elsewhere on the wafer. Other examples of some types of inorganic dielectrics to be used that will provide reproducible gap fill across the wafer include, but are not limited to: the silsesquioxane HOSP, methylsilsesquioxane (MSQ®), hydrogen silsesquioxane (HSQ®), MSQ-HSQ copolymers, and SACVD or PECVD SiO$_2$ deposited using oxygen or N$_2$O as an oxidizer and tetraethylorthosilicate (TEOS) or silane as a silicon source. It is understood that a key aspect to this process step is that each of the etched pixel openings 51 all have substantially the same aspect ratio, to achieve good fill uniformity. After the gap refill process, there may be optionally performed a planarization step whereby a reverse opening mask (opposite polarity resist) may be utilized followed by an etchback process and, an optional CMP step performed as now described with respect to FIGS. 3(a)–3(f).

Figure 3C:
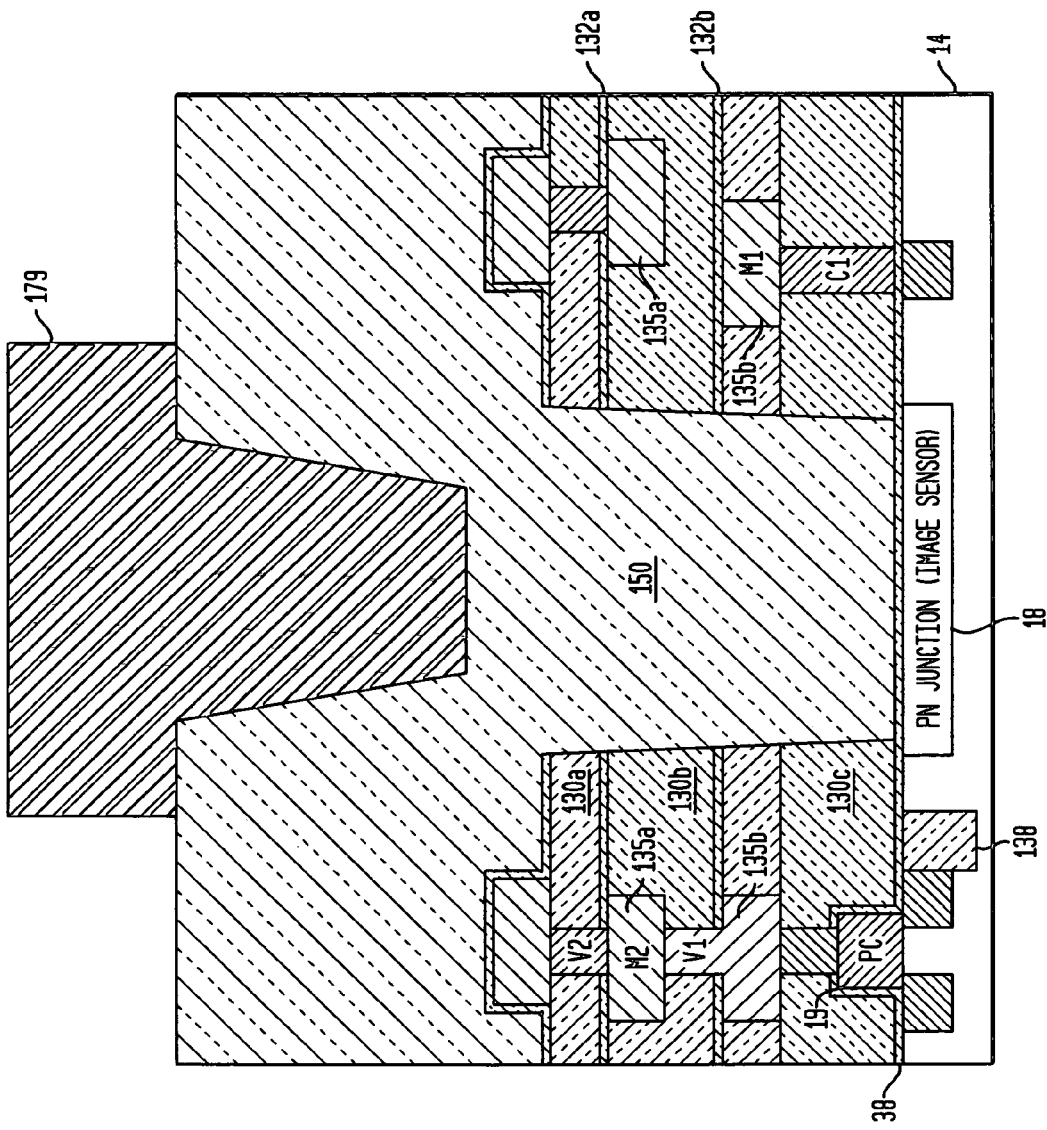
Figure 3D:
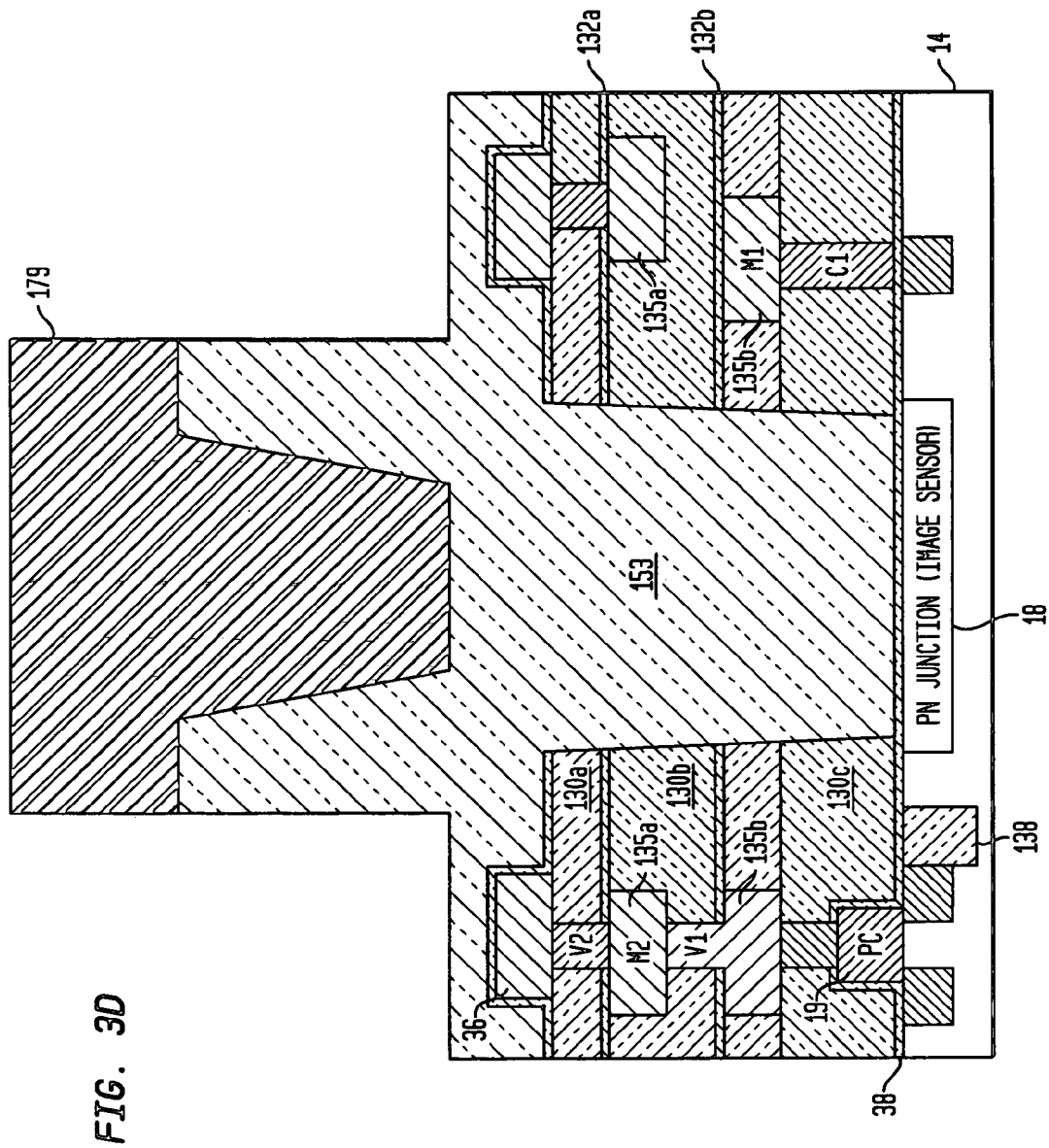
Figure 3E:
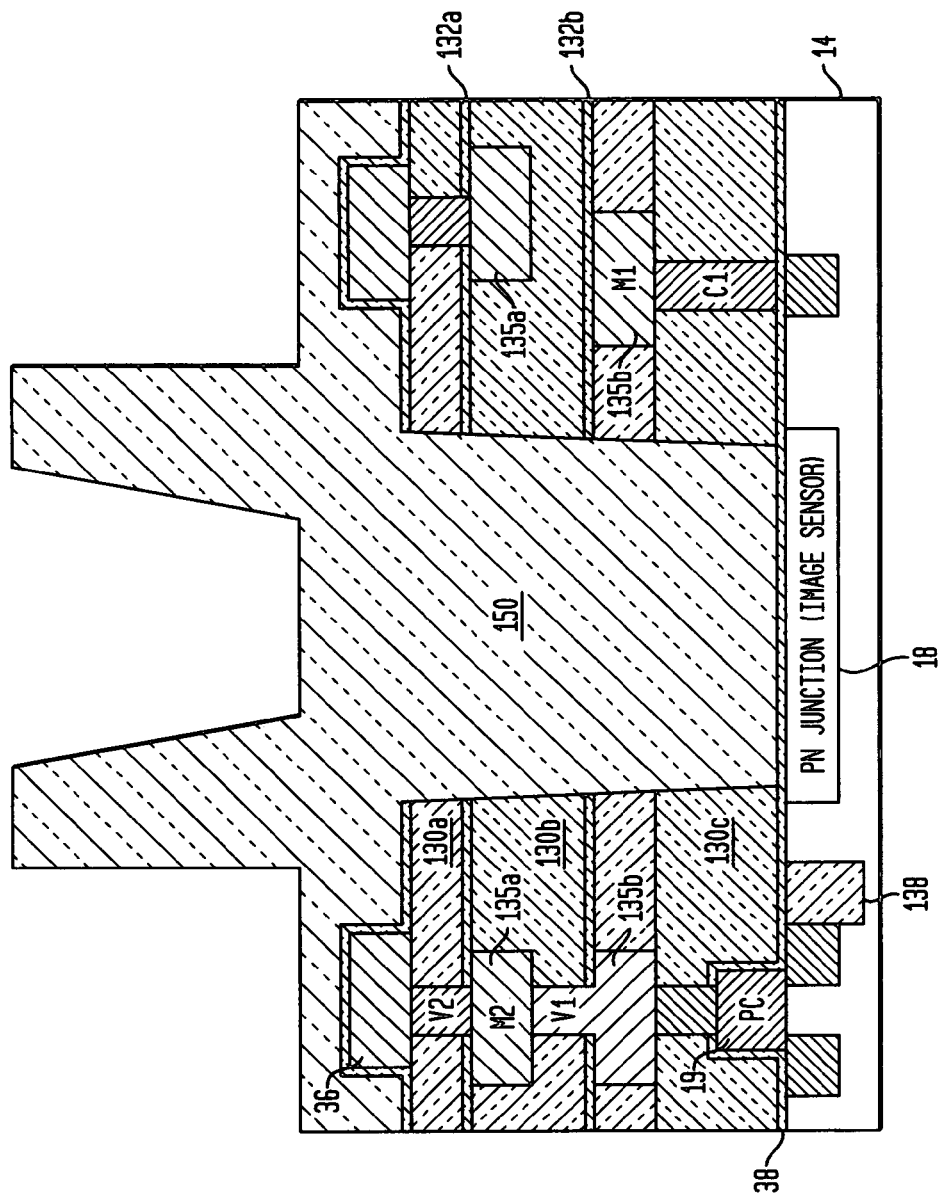

Particularly, as shown in FIG. 3(a) the wafer is fabricated and a trench 149 is etched where image sensor will be formed. Then, a next step depicted in FIG. 3(b) involves depositing a dielectric material 150 (e.g. SiO$_2$) to a thickness such that the trench is overfilled. Next, as shown in FIG. 3(c), using the same lithographic mask (or optionally, using a similar but different lithographic mask) that was used for patterning the trench over the image sensor but with the opposite polarity of photoresist, expose and develop resist 179. Then, as depicted in FIG. 3(d) the dielectric is etched to a predetermined depth above the surface of dielectric fill 150. Next, as depicted in FIG. 3(e), the photoresist 179 is stripped and finally, as depicted in FIG. 3(f) a CMP planarization step is performed to result in the structure depicted in FIG. 3(f). Alternatively, a CMP process step is employed with optional sacrificial deposition of a second dielectric as known in the art (e.g., SiN if SiO$_2$ is used for fill; SiO$_2$ or SiN if polymer refill is used) to prevent CMP erosion of the dielectric in the opening (i.e., prevent thickness non-uniformity under the color filter 25). It is understood however, that a self-aligned approach may be implemented with respect to the color filter material, then either a reverse opening mask followed by an etchback may be performed; or a CMP step, with optional sacrificial deposition of a second dielectric (e.g., SiN if SiO$_2$ is used for fill; SiO$_2$ or SiN if polymer refill is used) to prevent CMP erosion of the dielectric in the opening (prevent thickness non-uniformity of the color filter). In an alternative embodiment, a "squeegee" process may be implemented to fill holes with flowable material (such as polyimide). Although not shown in FIG. 3, it is understood that a metal contact/wiring guard ring may be additionally fabricated to prevent mobile ion diffusion (ambient ions such as sodium or potassium) into the active pixel region that may enter through the lens and color filter. Such a metal guard ring functions as a mobile ion barrier and is formed of a material or stack of materials including metals and vias surrounding the refill dielectric 150 between optical path and the active silicon region 19.

In another embodiment, the terminal or final via mask may be used to perform this etch if there is high enough selectivity to the last metal level 36 that is opened up in pads. FIG. 2(*a*) shows an image sensor, processed through the final wiring levels and passivation dielectric 29. Next, the terminal via 49, for opening up the wirebond or soldier bump pads 36, and the opening 59 for the image sensor color filter, are patterned using one mask and dielectric etching step as shown in FIG. 2(*b*). Next, the wafer processing and packaging are performed, including dicing the chip, packaging it with an optional lens, and wirebonding 69 the chip to the package as shown in FIG. 2(*c*). Thus, only one mask is needed to remove both metallization barrier layers 132*a,b* in a single step etch process.

Figure 4:
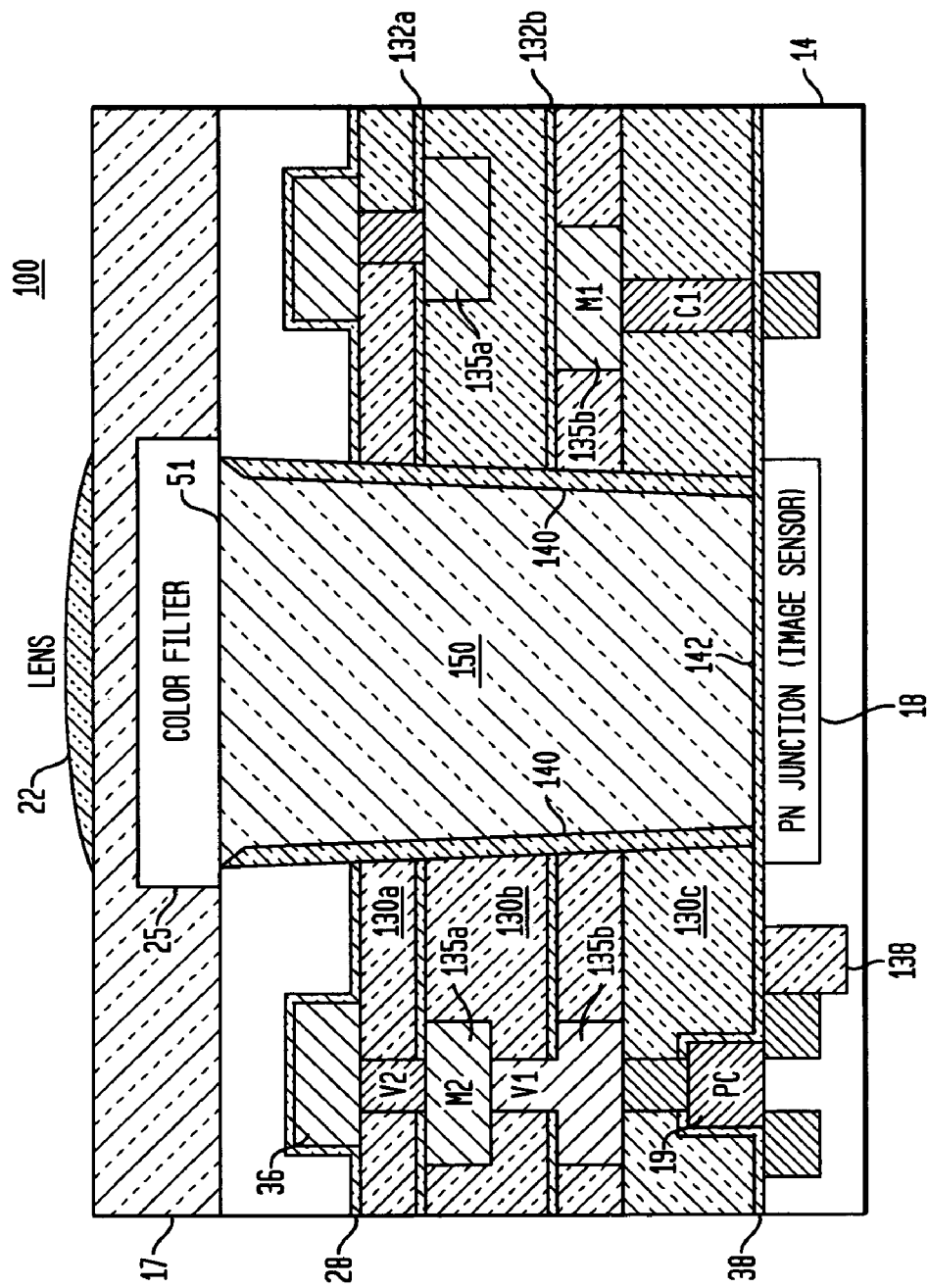
FIG. 4 illustrates, through a cross-sectional view, the image sensor array pixel of the invention formed with a reflective liner material at the sidewalls of an etched pixel opening and including a barrier material layer at the top of the substrate.

In an alternate embodiment depicted in FIG. 4, after opening the hole 51 in each pixel's optical path and prior to filling the hole with the interlevel dielectric (e.g., oxide), a thin liner 140 is deposited that conforms to the sidewalls and bottom of the etched hole. Subsequently, a spacer etch process is performed, to leave the liner on the sidewalls but remove it from the bottom 142 and top surfaces, as known in the art. Preferably, a thin nitride liner material, e.g., SiN, SiC, SiCN, etc., or a metal having light reflective properties may be deposited to line the bottom and sidewalls of the etched opening using known deposition techniques such as PE-CVD. For example, other liner materials having light reflective properties include but are not limited to: SiC, certain metals, e.g. Al, TiN, Tungsten, Ru, Poly-Si, Poly-Ge, etc. This thin liner 140 may be deposited to a thickness ranging between 50 Å to 2 kÅ and effectively functions to prevent mobile ion ingress into the active area of the chip and additionally act as a reflecting surface to reflect incident light so that any light that enters the lens 22 at an angle will reach the photodiode 18. In a subsequent step, after depositing the thin liner 140, the interlevel dielectric material is deposited back into the lined hole utilizing, e.g. a spin-on $SiO_2$ refill process or CVD process, as described hereinabove, and a final planarization step is optionally performed. If the refilled dielectric 150 is SiO2 with a refractive index n of 1.46 (k~0) and the sidewall liner 140 is SiN with a refractive index of 1.98 (k~0), then a percentage of incident light on the SiN will be reflected, as predicted by Bragg's Law. Alternatively, the degree of reflection could be increased by employing a higher refractive index conductor or semiconductor, such as silicon or tantalum for spacer 140.

Figure 5:
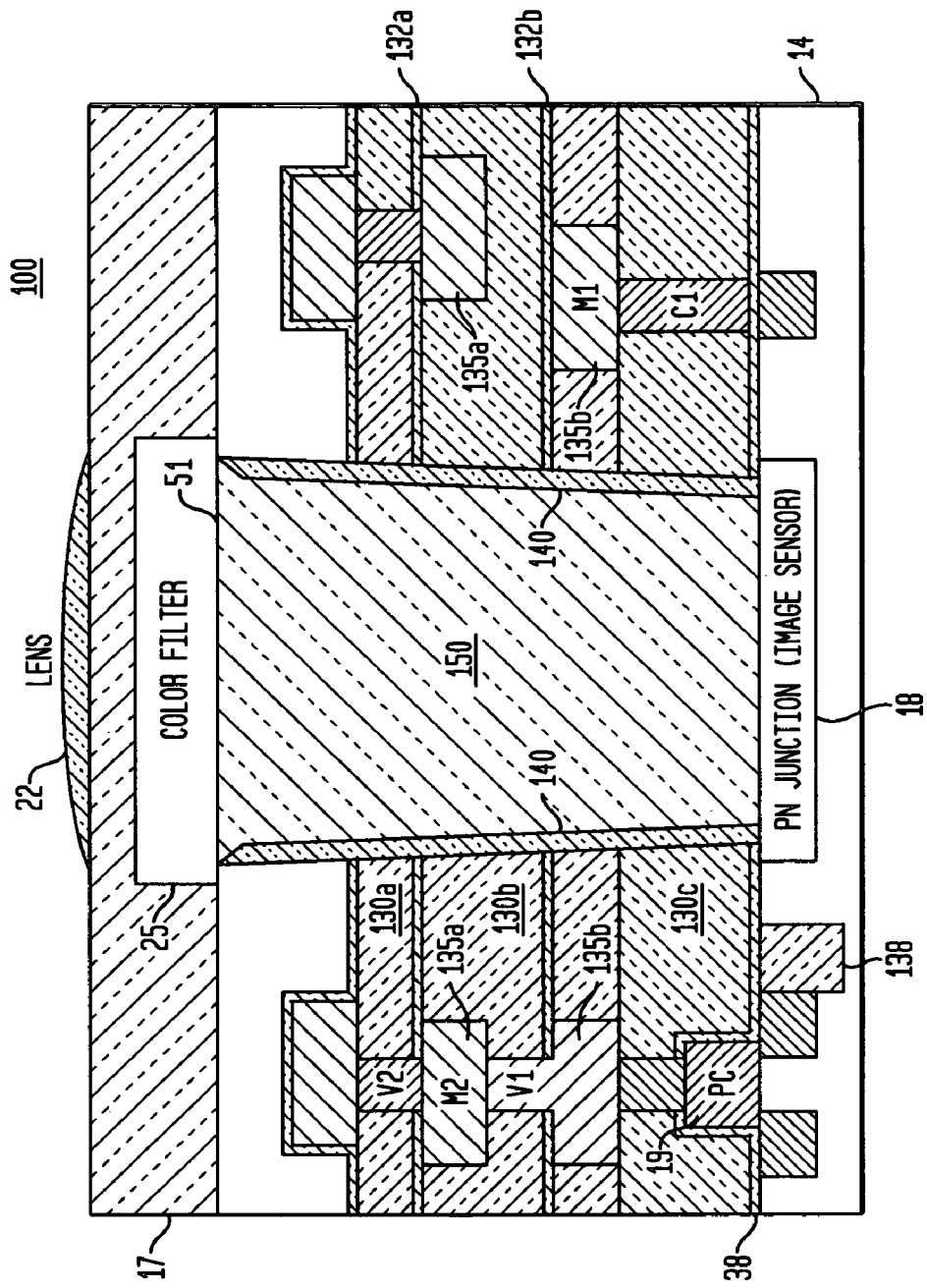
FIG. 5 illustrates, through a cross-sectional view, the image sensor array pixel of the invention formed with a reflective liner material at the sidewalls of an etched pixel opening and without the barrier material layer at the top of the substrate.

FIG. 5 depicts an alternate embodiment wherein the opening 51 has been patterned and an etch conducted down to the surface of the substrate 14 to remove the substrate nitride barrier 38. After opening the hole 51 in the pixel's optical path and prior to filling the hole with the interlevel dielectric (e.g., oxide) 150, the thin nitride liner 140 is deposited that conforms to the sidewalls and bottom of the etched hole using known deposition techniques described herein. such as PE-CVD. Thereafter, the reflective liner material 140 conforming to the bottom of the hole is removed by a spacer etch, i.e., any directional etch that is used to form SiN spacers along the sidewalls of an etched opening. For example, a F-based directional etch using a PFC or HFC as a fluorine source such as CF4 is used to form SiN spacers. In a subsequent step, after depositing the thin nitride and etching to form spacers 140, the interlevel dielectric material 150 is deposited back into the lined hole utilizing, e.g. a spin-on $SiO_2$ refill process or other technique as described herein, and a final planarization step is optionally performed.

Figure 6:
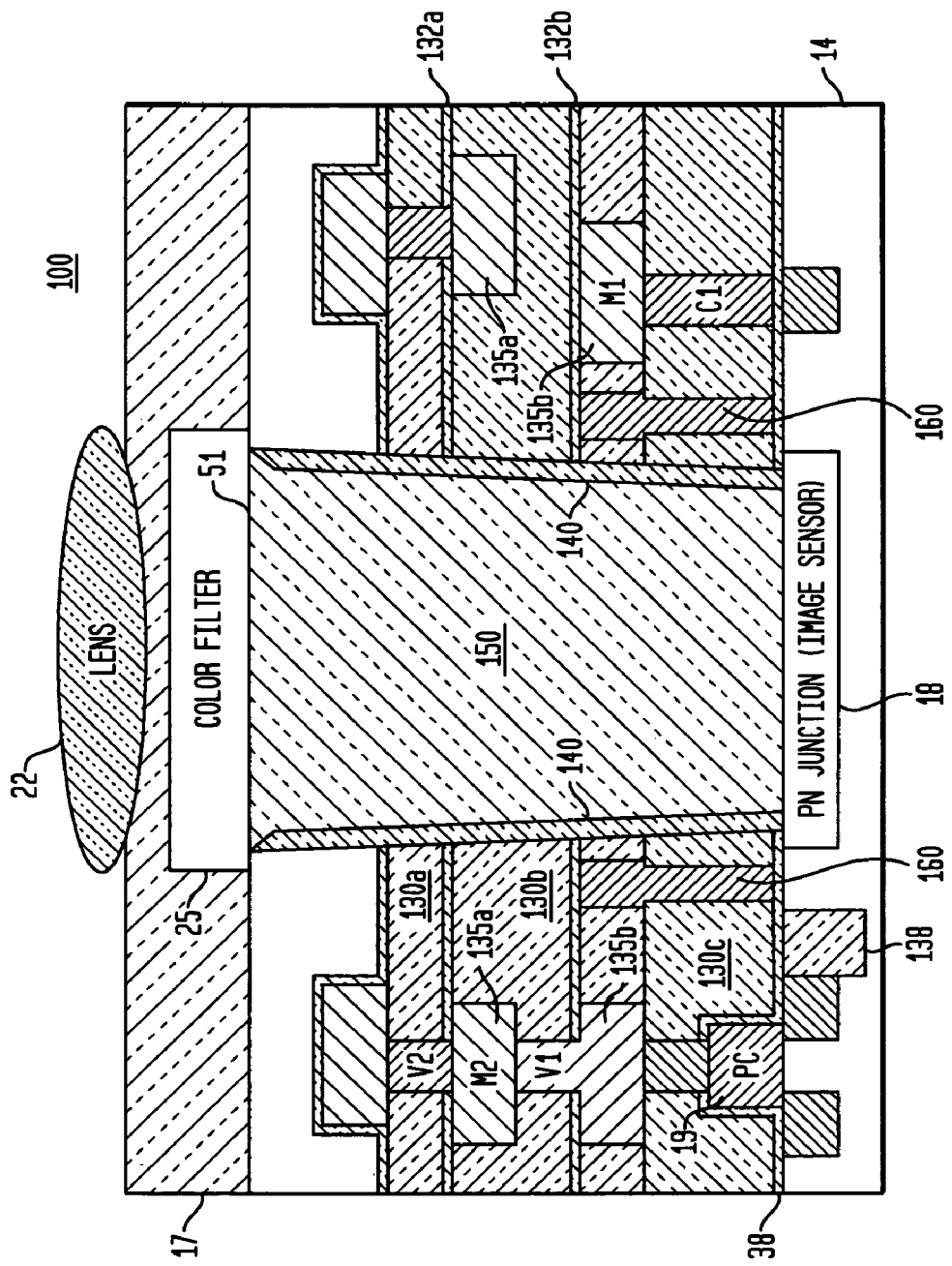
FIG. 6 illustrates, through a cross-sectional view, an example embodiment of the image sensor array pixel of FIG. 5, formed with an additional contact/metal guard ring structure surrounding the refill pixel dielectric.

FIG. 6 depicts an alternate embodiment of the invention depicted in FIG. 5 (including nitride spacer material 140) where the opening 51 has been patterned and an etch conducted down to the surface of the substrate 14 to remove the substrate nitride barrier 38. As shown in FIG. 6, a metal contact/wiring guard ring 160 has been additionally fabricated to prevent mobile ion ingress into the active pixel region that may enter through the lens and color filter. This metal guard ring 160 functions as a mobile ion barrier and is formed coincident with the normal wires and vias on the wafer of a material or stack of materials including tungsten 160 and refractory metal lined copper 135*b* surrounding the refill dielectric 150 between optical path and the active silicon region 19. In general, the guard ring is formed of whatever conductors are used for the on chip wiring, including Cu, AlCu, W, Ta, TaN, TiN, WN, Ag, Au, etc. The guard ring 160 is wired into the substrate 14 and grounded (connected to the lowest potential in the wafer) so that positive mobile ions would be attracted to the guard ring and not get into the active area 19 of the chip. As shown in FIG. 6, the metal contact/wiring guard ring 160 is fabricated vertically up to the nearest nitride level, e.g, M1 metallization nitride barrier 132*b*, however, it could be fabricated up to the last metal level.

Figure 7:
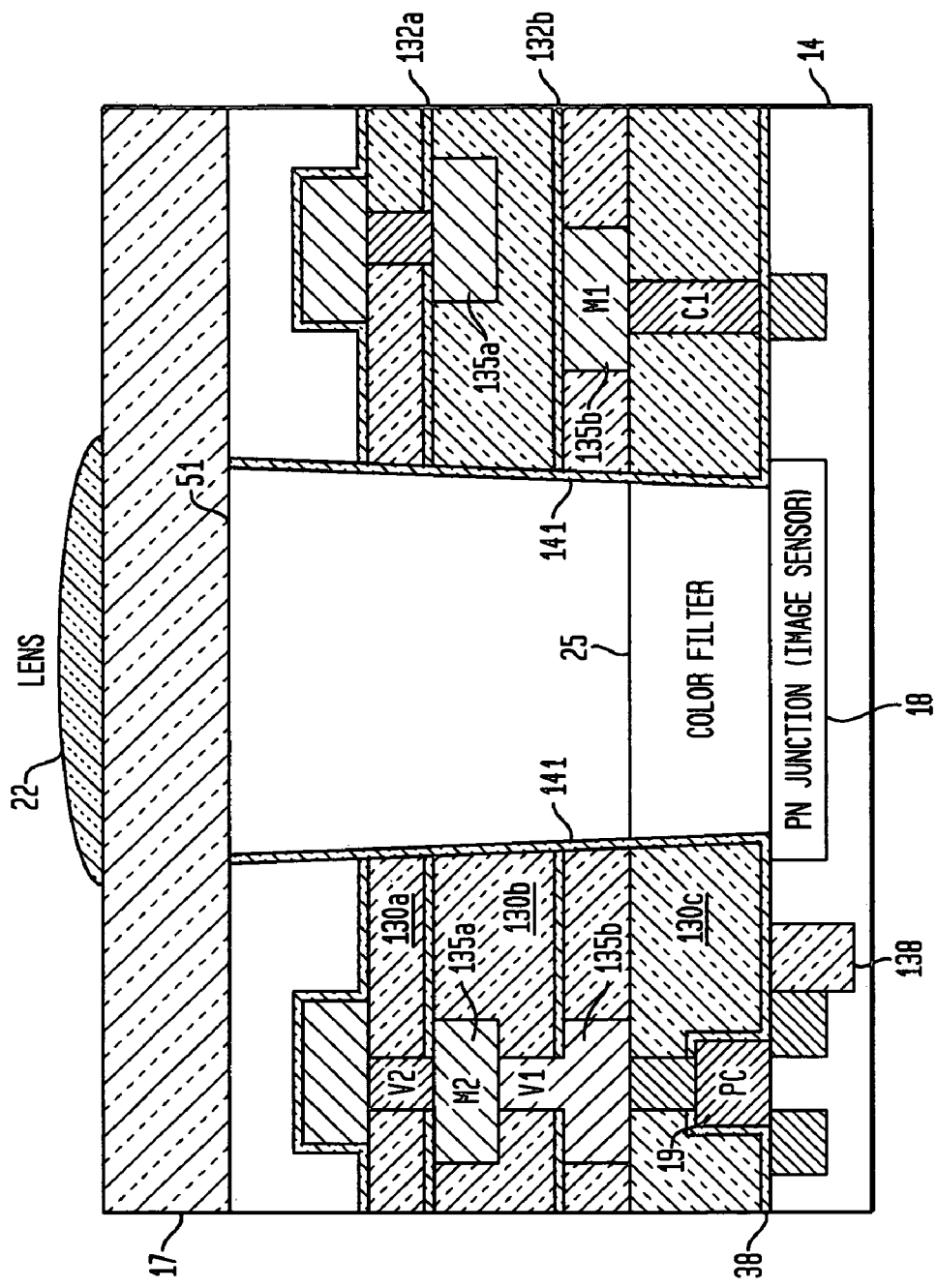
FIG. 7 illustrates, through a cross-sectional view, an example embodiment of the image sensor array pixel having a color filter element formed atop said substrate at the bottom of an etched pixel opening defining said optical path.
Figure 8:
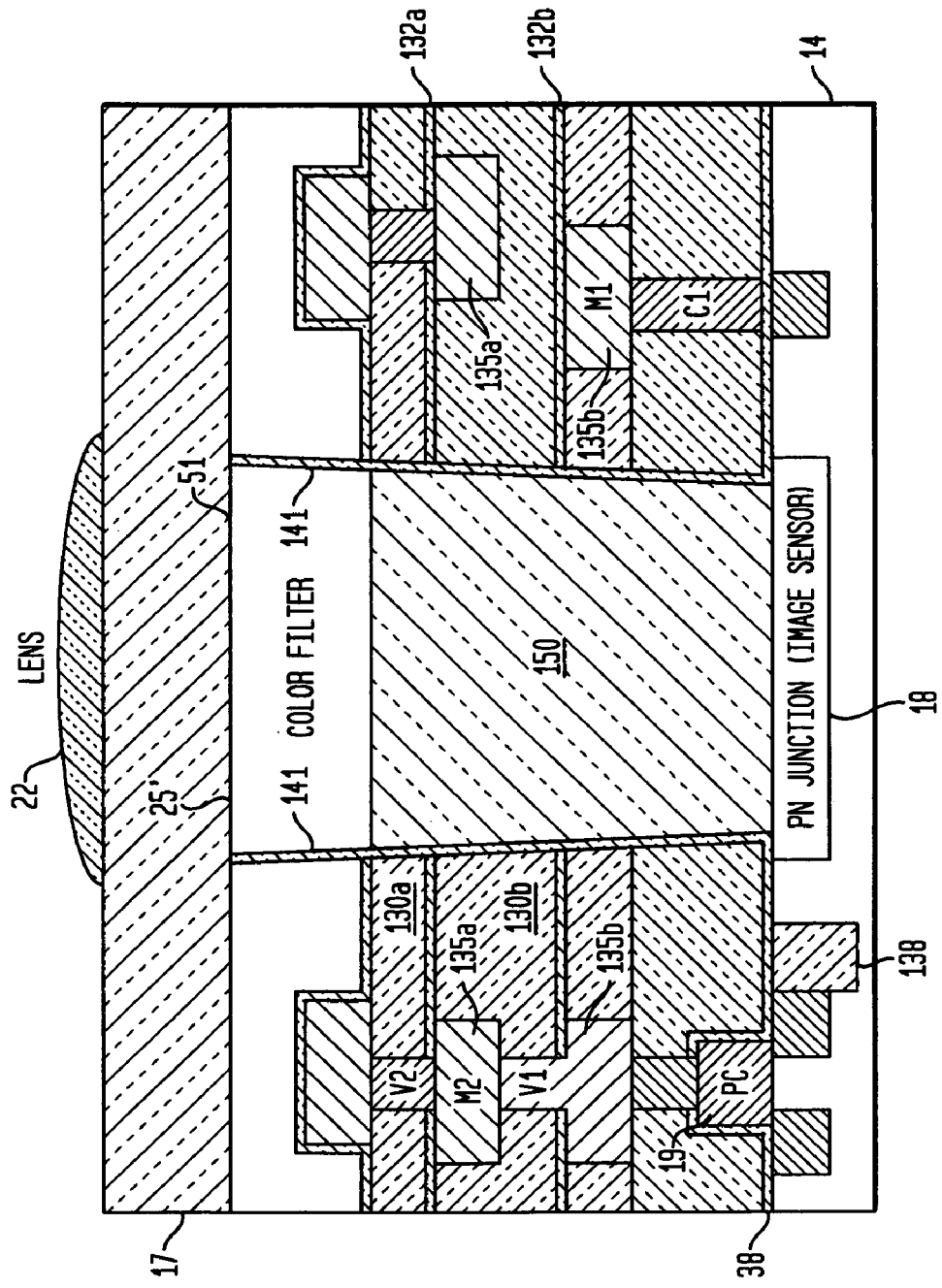
FIG. 8 illustrates, through a cross-sectional view, the image sensor array pixel comprising a color filter element formed atop a refill dielectric structure that partially fills an etched pixel opening defining said optical path; and, FIG. 9 illustrates, through a cross-sectional view, the image sensor array pixel comprising a color filter element formed in an etched back portion of the refill dielectric structure that fills an etched pixel opening defining said optical path.

FIG. 7 depicts an alternate embodiment of the invention wherein, after patterning and etching opening 51 into the pixel, the color filter 25' is formed at the bottom of the trench opening. In this embodiment, there may or may not be refill dielectric material added. Furthermore, an optional reflective sidewall liner as discussed hereinabove is formed that extends the whole length of the trench, i.e., to the bottom of the color filter material, or to the top of the color filter material. FIG. 8 depicts an alternate embodiment of the invention wherein, after patterning and etching opening 51 into the pixel, the refill dielectric material 150 is partially filled in the etched opening, and the color filter 25' is formed at the top of the trench opening above. In the embodiment depicted in FIG. 7, the optional absorptive or reflective liner 141 are formed on the sidewalls, extending to the bottom of the trench. In an alternate embodiment depicted in FIG. 9, after the refill dielectric material 150 is filled in the etched opening 51, an isotropic etchback process is performed to form a shallow second opening 52 of the refill dielectric where a color filter 25" is subsequently formed in a non-self-aligned process. It should be understood that this embodiment may be combined with any of the other structures described herein without the self aligned color filter.

Referring to the embodiments described herein with respect to FIGS. 7–9, if an opaque (absorptive) sidewall liner material 141 is used (i.e. k>0), such as silicon or tantalum, then two or more layers could be optimally combined together in a multilayer stack to achieve a particular k (dielectric constant), n (refractive index), or n and k value for the stack which is approximately independent of wavelength (WI) over the optical range. Possible absorptive sidewall liner materials include, but are not limited to: Ta, TaN, Si, Ti, Cu, AlCu, TiN, etc. Tables 1 (a) and 1 (b) below show the n and k values for the stack at various wavelengths for the indicated liner materials:

TABLE 1(a)

| WI | Ta | | Si | | Ti | |
|---|---|---|---|---|---|---|
| | n | k | n | k | n | k |
| 4000 | 2.3 | 2.7 | 4.5 | 2.1 | 1.8 | 2.9 |
| 5500 | 2.8 | 3.5 | 4.4 | 0.6 | 2.6 | 3.6 |
| 7000 | 3.4 | 4.0 | 4.1 | 0.3 | 3.7 | 4.1 |

TABLE 1(b)

| WI | Cu | | AlCu | | TiN | |
|---|---|---|---|---|---|---|
| | n | k | n | K | n | k |
| 4000 | 1.1 | 2.1 | 0.4 | 4.1 | 2.3 | 1.2 |
| 5500 | 0.8 | 2.7 | 0.8 | 5.6 | 2.1 | 1.5 |
| 7000 | 0.3 | 4.5 | 1.5 | 7.0 | 1.9 | 1.9 |

For example, if Ta and Si were combined together in multiple layers (2, 4, 6, 8, etc.) of equal thickness, then the combined n and k values would each have a variability range of 10% and 15%, respectively. This reduction in the n and k variability would result in uniform optical reflectivity over the wavelength range of 400 nm to 700 nm; and this variability is much less than any single layer.

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

What is claimed is:

1. An image sensor including an array of pixels, each pixel comprising:
   a top layer comprising a pixel microlens for receiving light;
   a semiconductor substrate including a light sensitive element formed therein for receiving light incident to said pixel microlens;
   a structure of dielectric material including sidewalls provided in an optical path between said top layer and said light sensitive element formed in said substrate,
   a multi-layer stack of light refractive material formed on said pixel sidewalls defining said optical path to achieve particular dielectric constant, and refractive index values for the multi-layer stack which is independent of incident light wavelength over an optical range, and
   a stack of interlevel dielectric material layers having two or more levels of Cu metallization formed therebetween with each said metallization level including a Cu metal wire structure formed adjacent said dielectric material structure of said pixel, each said Cu metal wire structure including a barrier material layer formed thereon,
   wherein said dielectric material structure is formed as part of a dielectric refill process after etching an opening in said pixel to define said optical path.

2. The image sensor pixel as claimed in claim 1, wherein each said interlevel dielectric layers of said stack is of a thickness ranging between 2 k to 20 k.

3. The image sensor pixel as claimed in claim 2, further including a barrier material layer formed between said substrate and a first interlevel dielectric layer.

4. The image sensor pixel as claimed in claim 1, further comprising a color filter element formed in said top layer beneath said pixel microlens and above said dielectric material structure formed in said optical path.

5. The image sensor pixel as claimed in claim 1, further comprising a color filter element formed atop said substrate above said light sensitive element and beneath said dielectric material structure in said optical path.

6. The image sensor pixel as claimed in claim 1, wherein said dielectric material structure partially fills an opening between etched pixel sidewalls defining said optical path, said sensor pixel further comprising a color filter element formed above said dielectric material structure at a top portion of said optical path between said sidewalls.

7. The image sensor pixel as claimed in claim 1, wherein said interlevel dielectric material fills said optical path between pixel sidewalls defining said optical path, said sensor pixel further comprising a color filter clement formed in an etched back portion of said interlevel dielectric material in said optical path.

8. The image sensor pixel as claimed in claim 1, wherein each pixel further comprises a layer of light reflective material formed on pixel sidewalls defining said optical path, said light reflective material layers enabling an increased amount of light received by said light sensitive element.

9. The image sensor pixel as claimed in claim 1, wherein each pixel comprises a layer of light absorptive material formed on pixel sidewalls defining said optical path.

10. The image sensor pixel as claimed in claim 1, further comprising a mobile ion barrier structure surrounding said interlevel dielectric material provided in said optical path, said mobile ion barrier structure connected to said substrate and extending upwards.

* * * * *